(12) United States Patent
Xia et al.

(10) Patent No.: US 8,767,333 B2
(45) Date of Patent: Jul. 1, 2014

(54) SYSTEMS AND METHODS FOR PATTERN DEPENDENT TARGET ADAPTATION

(75) Inventors: Haitao Xia, San Jose, CA (US); Dahua Qin, Allentown, PA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 186 days.

(21) Appl. No.: 13/239,719

(22) Filed: Sep. 22, 2011

(65) Prior Publication Data

US 2013/0077186 A1    Mar. 28, 2013

(51) Int. Cl.
*G11B 5/35* (2006.01)
(52) U.S. Cl.
USPC ............ 360/65; 360/25; 360/32; 360/46
(58) Field of Classification Search
None
See application file for complete search history.

(56) References Cited

U.S. PATENT DOCUMENTS

| | | | |
|---|---|---|---|
| 5,278,703 A | 1/1994 | Rub | |
| 5,278,846 A | 1/1994 | Okayama et al. | |
| 5,317,472 A | 5/1994 | Schweitzer, III | |
| 5,325,402 A | 6/1994 | Ushirokawa | |
| 5,392,299 A | 2/1995 | Rhines et al. | |
| 5,471,500 A | 11/1995 | Blaker et al. | |
| 5,513,192 A | 4/1996 | Janku et al. | |
| 5,523,903 A | 6/1996 | Hetzler et al. | |
| 5,550,870 A | 8/1996 | Blaker et al. | |
| 5,612,964 A | 3/1997 | Haraszti | |
| 5,701,314 A | 12/1997 | Armstrong et al. | |
| 5,710,784 A | 1/1998 | Kindred et al. | |
| 5,712,861 A | 1/1998 | Inoue et al. | |
| 5,717,706 A | 2/1998 | Ikeda | |
| 5,768,044 A | 6/1998 | Hetzler et al. | |

(Continued)

FOREIGN PATENT DOCUMENTS

| EP | 0522578 | 1/1993 |
|---|---|---|
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Dismery Mercedes
(74) *Attorney, Agent, or Firm* — Hamilton DeSanctis & Cha

(57) ABSTRACT

Various embodiments of the present invention provide systems and methods for data processing. As an example, a data processing circuit is disclosed that includes a noise predictive filter circuit, a data detector circuit, and a first and a second pattern dependent adaptive target circuits. The noise predictive filter circuit includes at least a first pattern dependent filter circuit operable to perform noise predictive filtering on a data input for a first pattern using a first adaptive target to yield a first noise predictive output, and a second pattern dependent filter circuit operable to perform noise predictive filtering on the data input for a second pattern using a second adaptive target to yield a second noise predictive output. The data detector circuit is operable to apply a data detection algorithm to the first noise predictive output and the second noise predictive output to yield a detected output. The first pattern dependent adaptive target circuit is operable to adaptively calculate the first adaptive target based at least in part on the first noise predictive output and a training sequence. The second pattern dependent adaptive target circuit operable to adaptively calculate the second adaptive target based at least in part on the second noise predictive output and the training sequence.

20 Claims, 4 Drawing Sheets

(56) References Cited

U.S. PATENT DOCUMENTS

| | | |
|---|---|---|
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,065,149 A | 5/2000 | Yamanaka |
| 6,097,764 A | 8/2000 | McCallister et al. |
| 6,145,110 A | 11/2000 | Khayrallah |
| 6,216,249 B1 | 4/2001 | Bliss et al. |
| 6,216,251 B1 | 4/2001 | McGinn |
| 6,229,467 B1 | 5/2001 | Eklund et al. |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,381,726 B1 | 4/2002 | Weng |
| 6,438,717 B1 | 8/2002 | Butler et al. |
| 6,473,878 B1 | 10/2002 | Wei |
| 6,476,989 B1 | 11/2002 | Chainer et al. |
| 6,625,775 B1 | 9/2003 | Kim |
| 6,657,803 B1 | 12/2003 | Ling et al. |
| 6,671,404 B1 | 12/2003 | Kawatani et al. |
| 6,748,034 B2 | 6/2004 | Hattori et al. |
| 6,757,862 B1 | 6/2004 | Marianetti, II |
| 6,785,863 B2 | 8/2004 | Blankenship et al. |
| 6,788,654 B1 | 9/2004 | Hashimoto et al. |
| 6,810,502 B2 | 10/2004 | Eidson |
| 6,889,154 B2 * | 5/2005 | Ashley et al. ............. 702/107 |
| 6,980,382 B2 | 12/2005 | Hirano et al. |
| 6,986,098 B2 | 1/2006 | Poeppelman |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greenberg et al. |
| 7,093,179 B2 | 8/2006 | Shea |
| 7,113,356 B1 | 9/2006 | Wu |
| 7,136,244 B1 | 11/2006 | Rothberg |
| 7,173,783 B1 | 2/2007 | McEwen et al. |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,236,757 B2 | 6/2007 | Raghaven et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,403,752 B2 | 7/2008 | Raghaven et al. |
| 7,430,256 B2 | 9/2008 | Zhidkov |
| 7,502,189 B2 | 3/2009 | Sawaguchi et al. |
| 7,505,537 B1 | 3/2009 | Sutardja |
| 7,523,375 B2 | 4/2009 | Spencer |
| 7,587,657 B2 | 9/2009 | Haratsch |
| 7,590,168 B2 | 9/2009 | Raghaven et al. |
| 7,590,927 B1 | 9/2009 | Shih et al. |
| 7,702,989 B2 | 4/2010 | Graef et al. |
| 7,712,008 B2 | 5/2010 | Song et al. |
| 7,738,201 B2 | 6/2010 | Jin et al. |
| 7,743,314 B2 * | 6/2010 | Stockmanns et al. ......... 714/796 |
| 7,752,523 B1 | 7/2010 | Chaichanavong |
| 7,801,200 B2 | 9/2010 | Tan |
| 7,802,163 B2 | 9/2010 | Tan |
| 7,944,639 B1 * | 5/2011 | Wang ............................ 360/65 |
| 8,027,409 B2 * | 9/2011 | Aziz et al. .................... 375/316 |
| 8,184,390 B1 * | 5/2012 | Xia et al. ........................ 360/43 |
| 2003/0063405 A1 | 4/2003 | Jin et al. |
| 2003/0081693 A1 | 5/2003 | Raghaven et al. |
| 2003/0087634 A1 | 5/2003 | Raghaven et al. |
| 2003/0112896 A1 | 6/2003 | Raghaven et al. |
| 2003/0134607 A1 | 7/2003 | Raghaven et al. |
| 2004/0071206 A1 * | 4/2004 | Takatsu ........................ 375/232 |
| 2004/0098659 A1 | 5/2004 | Bjerke et al. |
| 2005/0010855 A1 | 1/2005 | Lusky |
| 2005/0078399 A1 | 4/2005 | Fung |
| 2005/0111540 A1 | 5/2005 | Modrie et al. |
| 2005/0157780 A1 | 7/2005 | Werner et al. |
| 2005/0195749 A1 | 9/2005 | Elmasry et al. |
| 2005/0216819 A1 | 9/2005 | Chugg et al. |
| 2005/0249318 A1 * | 11/2005 | Minemura .................... 375/341 |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0123285 A1 | 6/2006 | De Araujo et al. |
| 2006/0140311 A1 | 6/2006 | Ashley et al. |
| 2006/0168493 A1 | 7/2006 | Song et al. |
| 2006/0176947 A1 * | 8/2006 | Lim ............................... 375/232 |
| 2006/0195772 A1 | 8/2006 | Graef et al. |
| 2006/0210002 A1 | 9/2006 | Yang et al. |
| 2006/0248435 A1 | 11/2006 | Haratsch |
| 2006/0256670 A1 | 11/2006 | Park et al. |
| 2006/0259263 A1 * | 11/2006 | Ashley et al. ................ 702/107 |
| 2007/0011569 A1 | 1/2007 | Casado et al. |
| 2007/0047121 A1 | 3/2007 | Eleftheriou et al. |
| 2007/0047635 A1 | 3/2007 | Stojanovic et al. |
| 2007/0110200 A1 | 5/2007 | Mergen et al. |
| 2007/0230407 A1 | 10/2007 | Petrie et al. |
| 2007/0286270 A1 | 12/2007 | Huang et al. |
| 2008/0049825 A1 | 2/2008 | Chen et al. |
| 2008/0055122 A1 | 3/2008 | Tan |
| 2008/0065970 A1 | 3/2008 | Tan |
| 2008/0069373 A1 | 3/2008 | Jiang et al. |
| 2008/0168330 A1 | 7/2008 | Graef et al. |
| 2008/0276156 A1 | 11/2008 | Gunnam |
| 2008/0301521 A1 | 12/2008 | Gunnam |
| 2010/0101578 A1 | 4/2009 | Zhongwang et al. |
| 2009/0161245 A1 * | 6/2009 | Mathew et al. ................. 360/65 |
| 2009/0161747 A1 * | 6/2009 | Aziz et al. .................... 375/231 |
| 2009/0185643 A1 | 7/2009 | Fitzpatrick et al. |
| 2009/0199071 A1 | 8/2009 | Graef |
| 2009/0235116 A1 | 9/2009 | Tan et al. |
| 2009/0235146 A1 | 9/2009 | Tan |
| 2009/0259915 A1 | 10/2009 | Livshitz et al. |
| 2009/0268575 A1 * | 10/2009 | Tan et al. .................... 369/53.41 |
| 2009/0273492 A1 | 11/2009 | Yang et al. |
| 2009/0274247 A1 | 11/2009 | Galbraith et al. |
| 2010/0002795 A1 | 1/2010 | Raghaven et al. |
| 2010/0042877 A1 | 2/2010 | Tan |
| 2010/0042890 A1 | 2/2010 | Gunnam |
| 2010/0050043 A1 | 2/2010 | Savin |
| 2010/0061492 A1 | 3/2010 | Noeldner |
| 2010/0070837 A1 | 3/2010 | Xu et al. |
| 2010/0164764 A1 | 7/2010 | Nayak |
| 2010/0185914 A1 | 7/2010 | Tan et al. |
| 2011/0075569 A1 | 3/2011 | Marrow et al. |
| 2011/0080211 A1 | 4/2011 | Yang et al. |
| 2011/0167246 A1 | 7/2011 | Yang et al. |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.

(56) References Cited

OTHER PUBLICATIONS

U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.
U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low- denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of ULM 2005.
Sari H et al., "Transmission Techniques for Digital Terrestrial TV Broadcasting" IEEE Communications Magazine, IEEE Service Center NY, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. On Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.

(56) References Cited

OTHER PUBLICATIONS

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VLSI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

* cited by examiner

US 8,767,333 B2

SYSTEMS AND METHODS FOR PATTERN DEPENDENT TARGET ADAPTATION

BACKGROUND OF THE INVENTION

The present invention is related to systems and methods for data processing, and more particularly to systems and methods for noise predictive filtering in data processing.

Data processing circuits often include a data detector circuit including noise predictive filtering. The noise predictive filtering includes a number of pattern dependent filters that use a common output from the data detector circuit to select one target used by all of the pattern dependent filters. In some cases, the identified target is less than ideal resulting in a degraded operation of the associated data processing circuit.

Hence, for at least the aforementioned reasons, there exists a need in the art for advanced systems and methods for data processing.

BRIEF SUMMARY OF THE INVENTION

The present invention is related to systems and methods for data processing, and more particularly to systems and methods for noise predictive filtering in data processing.

Various embodiments of the present invention provide data processing circuits that include: a noise predictive filter circuit, a data detector circuit, and a first and a second pattern dependent adaptive target circuits. The noise predictive filter circuit includes at least a first pattern dependent filter circuit operable to perform noise predictive filtering on a data input for a first pattern using a first adaptive target to yield a first noise predictive output, and a second pattern dependent filter circuit operable to perform noise predictive filtering on the data input for a second pattern using a second adaptive target to yield a second noise predictive output. The data detector circuit is operable to apply a data detection algorithm to the first noise predictive output and the second noise predictive output to yield a detected output. The first pattern dependent adaptive target circuit is operable to adaptively calculate the first adaptive target based at least in part on the first noise predictive output and a training sequence. The second pattern dependent adaptive target circuit operable to adaptively calculate the second adaptive target based at least in part on the second noise predictive output and the training sequence.

In some instances of the aforementioned embodiments, the training sequence is a portion of the detected output corresponding to the data input. In other instances of the aforementioned embodiments, the training sequence is a known data set stored in a memory. The data detection algorithm may be, but is not limited to, a Viterbi data detection algorithm or a maximum a posteriori data detection algorithm. Of note, the general phrase "Viterbi data detection algorithm" is used in its broadest sense to mean any Viterbi detection algorithm or variations thereof including, but not limited to, bi-direction Viterbi detection algorithm. Also, the general phase "maximum a posteriori data detection algorithm" is used in its broadest sense to mean any maximum a posteriori detection algorithm or variations thereof including, but not limited to, simplified maximum a posteriori data detection algorithm and a max-log maximum a posteriori data detection algorithm.

In various instances of the aforementioned embodiments, the data processing circuit further includes a data decoding circuit operable to apply a data decode algorithm to the detected output to yield a decoded output. In some cases, the data decode algorithm is a low density parity check algorithm. In particular cases, the data processing circuit further includes: an analog to digital converter circuit operable to convert an analog input into a series of digital samples; and an equalizer circuit operable to receive the series of digital samples and to equalize the series of digital samples to yield the data input.

In some instances of the aforementioned embodiments, adaptively calculating the first adaptive target based at least in part on the first noise predictive output and a training sequence includes multiplying an ideal output by a programmable adaptation gain. In some such instances, the ideal output is calculated in accordance with the following equation:

$$\text{ideal output} = \sum_{j=1}^{D} T_j b_{D-j},$$

where D is the depth of a pattern, T is the adaptive target, and b is the training sequence.

Other embodiments of the present invention provide methods that include: receiving a data input; pattern dependent filtering the data input using a first pattern dependent filter for a first pattern using a first adaptive target to yield a first noise predictive output; pattern dependent filtering the data input using a second pattern dependent filter for a second pattern using a second adaptive target to yield a second noise predictive output; applying a data detection algorithm to the first noise predictive output and the second noise predictive output to yield a detected output; calculating in a first pattern dependent adaptive target circuit the first adaptive target based at least in part on the first noise predictive output and a training sequence; and calculating in a second pattern dependent adaptive target circuit the second adaptive target based at least in part on the second noise predictive output and the training sequence.

Yet other embodiments of the present invention provide A storage devices that include: a storage medium; a head assembly disposed in relation to the storage medium and operable to provide a sensed signal corresponding to information on the storage medium; and a read channel circuit. The read channel circuit includes: an analog to digital converter circuit operable to sample an analog signal derived from the sensed signal to yield a series of digital samples; an equalizer circuit operable to equalize the digital samples to yield an equalized output; a noise predictive filter circuit including at least a first pattern dependent filter circuit operable to perform noise predictive filtering on the equalized output for a first pattern using a first adaptive target to yield a first noise predictive output, and a second pattern dependent filter circuit operable to perform noise predictive filtering on the equalized output for a second pattern using a second adaptive target to yield a second noise predictive output; a data detector circuit operable to apply a data detection algorithm to the first noise predictive output and the second noise predictive output to yield a detected output; a first pattern dependent adaptive target circuit operable to adaptively calculate the first adaptive target based at least in part on the first noise predictive output and a training sequence; and a second pattern dependent adaptive target circuit operable to adaptively calculate the second adaptive target based at least in part on the second noise predictive output and the training sequence.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for data processing, and more particularly to systems and methods for noise predictive filtering in data processing.

Various embodiments of the present invention provide a noise predictive filter including a bank of pattern dependent filter circuits each operating based upon a respective pattern and governed at least in part by an adaptive target. A respective adaptive target is calculated for each of the pattern dependent filter circuits. Such an approach provides target values adapted for individual pattern dependent filter circuits. By allowing the target values to adjust for a particular pattern dependent filter circuit independent of target values for other pattern dependent filter circuits, the target values more closely adapt actual conditions.

Figure 1:
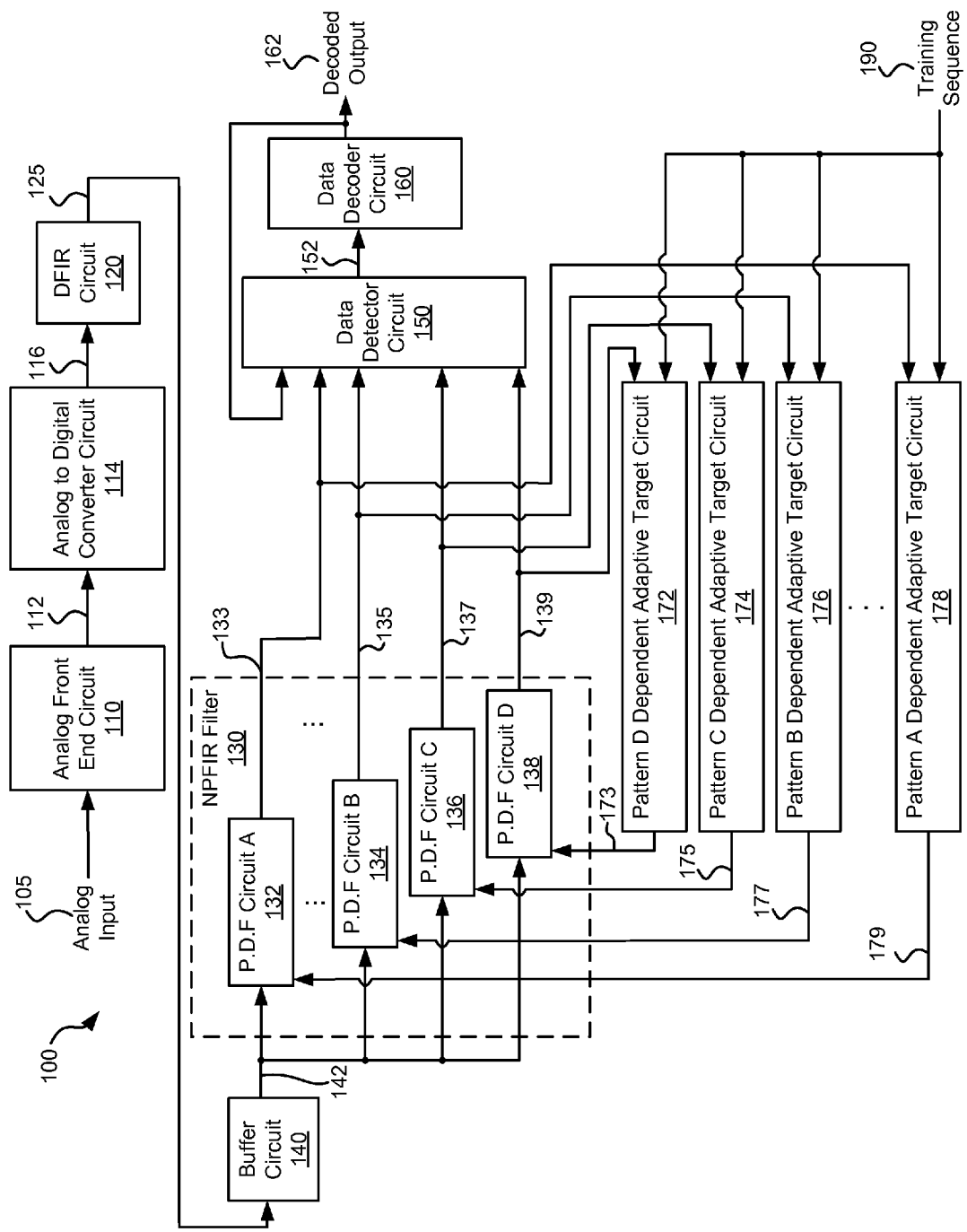
FIG. 1 shows a data processing circuit including multi-pattern noise predictive filter adaptation circuitry in accordance with one or more embodiments of the present invention.

Turning to FIG. 1, a data processing circuit 100 is shown that includes multi-pattern noise predictive filter adaptation circuitry in accordance with some embodiments of the present invention in accordance with some embodiments of the present invention. Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art.

Equalized output 125 is provided to a buffer circuit 140 that provides a buffered output 142 to noise predictive filter circuit 130. In particular, buffered output 142 is provided in parallel to a number of pattern dependent filter circuits (P.D.F. Circuit A 132, P.D.F. Circuit B 134, P.D.F. Circuit A 136, P.D.F. Circuit A 138) that are included as part of noise predictive filter circuit 130. Each of the pattern dependent filter circuits is tuned to perform noise predictive filtering for a particular pattern and using an adaptive target. In particular, operation of pattern dependent filter circuit 132 is tuned to a particular pattern and governed at least in part by an adaptive target 179; operation of pattern dependent filter circuit 134 is tuned to another particular pattern and governed at least in part by an adaptive target 177; operation of pattern dependent filter circuit 136 is tuned to another particular pattern and governed at least in part by an adaptive target 175; and operation of pattern dependent filter circuit 138 is tuned to another particular pattern and governed at least in part by an adaptive target 173.

Pattern dependent filter circuit 132 filters buffered output 142 according to a first pattern and governed by adaptive target 179 to yield a noise predictive output 133. Similarly, pattern dependent filter circuit 134 filters buffered output 142 according to a second pattern and governed by adaptive target 177 to yield a noise predictive output 135; pattern dependent filter circuit 136 filters buffered output 142 according to a first pattern and governed by adaptive target 175 to yield a noise predictive output 137; and pattern dependent filter circuit 138 filters buffered output 142 according to a first pattern and governed by adaptive target 173 to yield a noise predictive output 139. Pattern dependent filter circuits 132, 134, 136, 138 may be any filter circuits known in the art that are capable of providing a pattern dependent filtered output using an target input. In one particular embodiment, noise predictive filter circuit 130 includes eight pattern dependent filter circuits each tuned to a different three bit pattern (i.e., '000', '001', '010', '011', '100', '101', '110, and '111'), and a corresponding number of noise predictive outputs.

Noise predictive outputs 133, 135, 137, 139 are provided to a data detector circuit 150. Data detector circuit 150 applies a data detection algorithm to a selected one of noise predictive outputs 133, 135, 137, 139 to yield a detected output 152. The data detection algorithm may be any data detection algorithm known in the art. In some embodiments of the present invention, the data detection algorithm is a Viterbi algorithm data detection as is known in the art. Based upon the disclosure provided herein, one of ordinary skill in the art will recognize a variety of data detection algorithms that may be implemented as part of data detector circuit 150 in accordance with different embodiments of the present invention. Detected output 152 is provided to data decoder circuit 160 that applies a decode algorithm to detected output 152 to yield a decoded output 162. The data decode algorithm may be any data decode algorithm known in the art. In one particular embodiment of the present invention, the data decode algorithm is a low density parity check (LDPC) algorithm as are known in the art.

Where data decoder circuit 160 does not converge (i.e, fails to result in the properly decoded data set), decoded output 162 is fed back to data detector circuit 150 where it is used to guide a subsequent data detection of buffered output 142 by data detector circuit 150. Alternatively, where data decoder circuit 160 converges (i.e, results in the properly decoded data set), decoded output 162 is provided as an output from data processing circuit 100.

Figure 2:
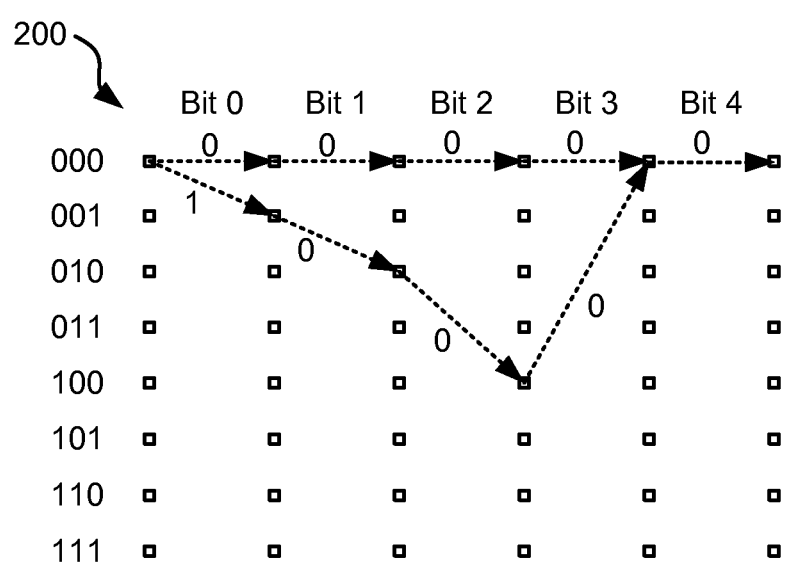
FIG. 2 shows an example trellis diagram of a Viterbi algorithm detection process of which the output is used to adaptively train pattern dependent target values in the data processing circuit of FIG. 1.

As shown in FIG. 2, an example trellis diagram 200 of a Viterbi algorithm detection process. Each path of trellis diagram 200 corresponds to a bit sequence. The ideal sample is bit sequence or pattern dependent, and the mean variance of the noise for each path is different and will affected by a training bit sequence 190. In some embodiments of the present invention, training bit sequence 190 may be detected output 152 or may be a canned expected data set. Since trellis diagram 200 is pattern dependent, each of noise predictive outputs 133, 135, 137, 139 are used for two of the path metrics within data detector circuit 150. The two paths corresponding to a noise predictive output corresponding to the '000' pattern are shown on trellis diagram 200 (i.e., the two four bit paths ending in '000'). Where there are eight noise predictive outputs (e.g., noise predictive output 133, 135, 137, 139), there are a total of sixteen (2*8) path metrics.

Returning to FIG. 1, pattern dependent adaptive target circuit 178, pattern dependent adaptive target circuit 176, dependent adaptive target circuit 174, pattern dependent adaptive target circuit 172 each use channel statistics and training sequence 190 to more accurately tune adaptive target 179, adaptive target 177, adaptive target 175, and adaptive target 173, respectively. In particular, each of the pattern dependent adaptive target circuits calculates an error as a squared difference between a respective noise predictive output (i.e., noise predictive outputs 133, 135, 137, 139) and an ideal output as set forth in the following equation:

$$\text{error} = (\text{noise predictive output} - \text{ideal output})^2.$$

The ideal output is calculated in accordance with the following equation:

$$\text{ideal output}_i = \sum_{j=1}^{D} T_{i,j} b_{D-j},$$

where i corresponds to a particular one of pattern dependent adaptive target circuits (pattern dependent adaptive target circuit 178, pattern dependent adaptive target circuit 176, pattern dependent adaptive target circuit 174, or pattern dependent adaptive target circuit 172); D is the depth of the path (i.e., the number of bits in the pattern). T is the adaptive target that is provided by the particular pattern dependent adaptive target circuit provided to the corresponding pattern dependent filter circuit. b is the corresponding portion of training bit sequence 190. Using this ideal output, the error is calculated in accordance with the following equation:

$$\text{error} = \left( \text{noise predictive output} - \sum_{j=1}^{D} T_{i,j} b_{D-j} \right)^2.$$

A scaled derivative of the error is set forth in the following equation:

$$\frac{\partial \text{error}}{\partial T_{i,j}} = -\eta * b_{D-j} \times \left( \text{noise predictive output} - \sum_{j=1}^{D} T_{i,j} b_{D-j} \right).$$

$\eta$ is a programmable adaptation gain. Adaptively resolving this equation results in values of an adaptive target provided to a corresponding pattern dependent filter circuit. Adaptive resolution is done using the following equation:

$$T_{i,j}(\text{Next Period}) =$$

$$T_{i,j}(\text{Prior Period}) - \eta * b_{D-j} \times \left( \text{noise predictive output} - \sum_{j=1}^{D} T_{i,j} b_{D-j} \right).$$

In some cases, initially T1 may be set to a value of '1', and T2 and T3 are each initially set to a value of '0'.

As set forth above, the target adaptation is pattern dependent. As an example, the adaptation of the respective target values may proceed as:

(A) The first noise predictive output (i.e., noise predictive output 133 from pattern dependent filter circuit 132) is used to train the target corresponding to paths '0000' and '1000' of the Viterbi trellis; the second noise predictive output is used to train the target corresponding to paths '0001' and '1001' of the Viterbi trellis; the third noise predictive output is used to train the target corresponding to paths '0010' and '1010' of the Viterbi trellis; the fourth noise predictive output is used to train the target corresponding to paths '0011' and '1011' of the Viterbi trellis; the fifth noise predictive output is used to train the target corresponding to paths '0100' and '1100' of the Viterbi trellis; the sixth noise predictive output (i.e., noise predictive output 135 from pattern dependent filter circuit 134) is used to train the target corresponding to paths '0101' and '1101' of the Viterbi trellis; the seventh noise predictive output (i.e., noise predictive output 137 from pattern dependent filter circuit 136) is used to train the target corresponding to paths '0110' and '1110' of the Viterbi trellis; and the eighth noise predictive output (i.e., noise predictive output 139 from pattern dependent filter circuit 138) is used to train the target corresponding to paths '0111' and '1111' of the Viterbi trellis.

(B) The adaptive algorithm set forth above is applied for each pattern dependent filter circuit of noise predictive filter circuit 130.

Using pattern dependent adaptive target circuit 178 as an example, the following equation is used to adaptively calculate adaptive target 179 (T1, T2, T3):

adaptive target 179=$T1,T2,T3$(Next Period)=

$T1, T2, T3$(Prior Period) −

-continued $$\eta * b_{D-j} \times \left(\text{noise predictive output } 133 - \sum_{j=1}^{D} T_j b_{D-j}\right).$$

Similarly, using pattern dependent adaptive target circuit 176 as an example, the following equation is used to adaptively calculate adaptive target 177 (T1, T2, T3):

adaptive target 177=$T1,T2,T3$(Next Period)=

$T1, T2, T3$(Prior Period) −

$$\eta * b_{D-j} \times \left(\text{noise predictive output } 135 - \sum_{j=1}^{D} T_j b_{D-j}\right);$$

using pattern dependent adaptive target circuit 174 as an example, the following equation is used to adaptively calculate adaptive target 177 (T1, T2, T3):

adaptive target 175=$T1,T2,T3$(Next Period)=

$T1, T2, T3$(Prior Period) −

$$\eta * b_{D-j} \times \left(\text{noise predictive output } 137 - \sum_{j=1}^{D} T_j b_{D-j}\right);$$

and adaptive target 173=$T1,T2,T3$(Next Period)=

$T1, T2, T3$(Prior Period) −

$$\eta * b_{D-j} \times \left(\text{noise predictive output } 139 - \sum_{j=1}^{D} T_j b_{D-j}\right).$$

Such an approach provides target values adapted for individual pattern dependent filter circuits. By allowing the target values to adjust for a particular pattern dependent filter circuit independent of target values for other pattern dependent filter circuits, the target values more closely adapt actual conditions.

Figure 3:
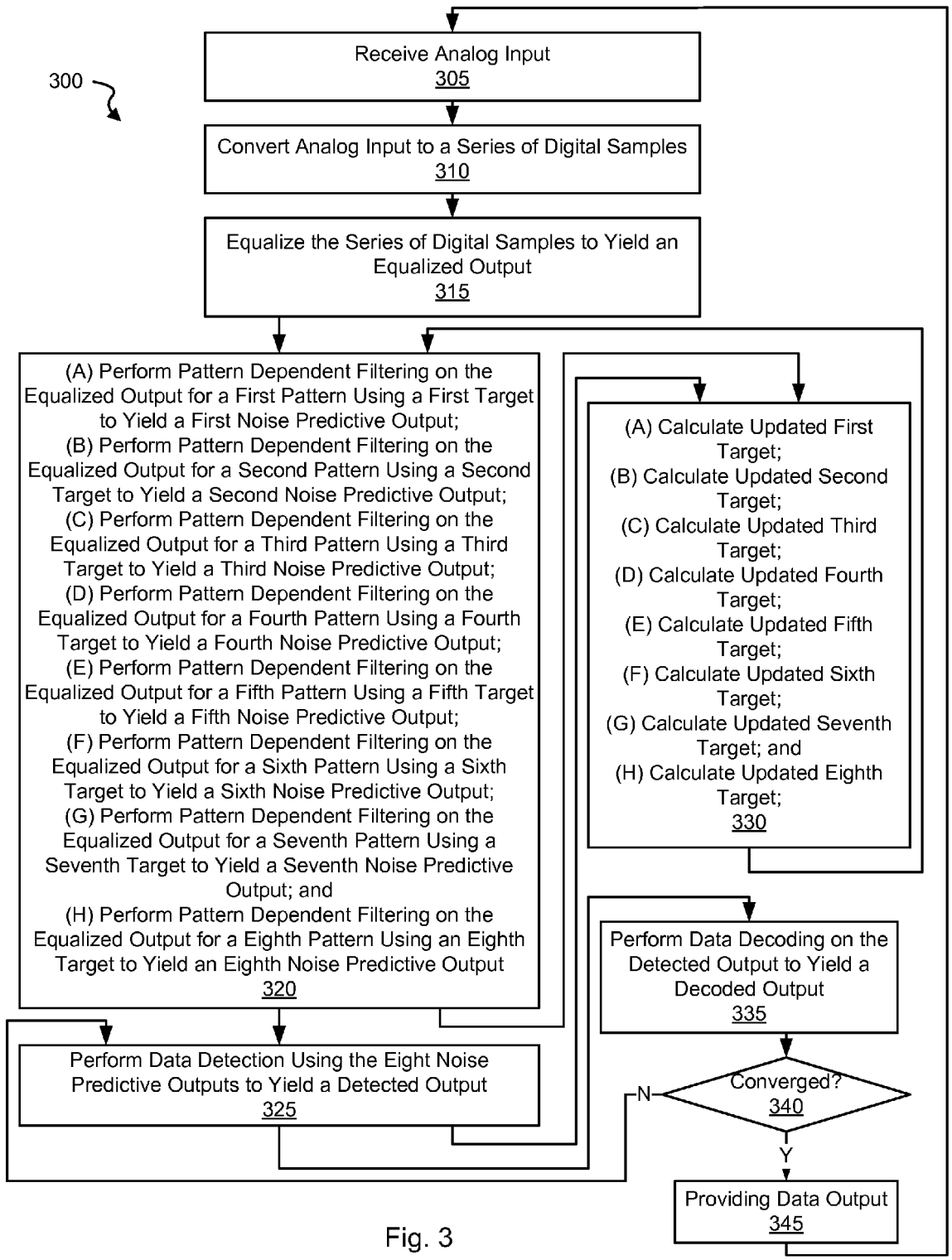
FIG. 3 is a flow diagram showing a method in accordance with one or more embodiments of the present invention for pattern dependent target adaptation.

Turning to FIG. 3, a flow diagram 300 shows a method in accordance with one or more embodiments of the present invention for pattern dependent target adaptation. Following flow diagram 300, an analog input signal is received (block 305). The analog input may be derived from, for example, a storage medium or a data transmission channel. Based upon the disclosure provided herein, one of ordinary skill in the art will recognize a variety of sources of the analog input. The analog input is converted to a series of digital samples (block 510). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 515). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. Of note, the equalized output may include both electronic noise and media noise.

Noise predictive filtering is applied to the equalized output (block 320). In particular, pattern dependent filtering on the equalized output is performed for a first pattern (e.g., '000') using a first target to yield a first noise predictive output, pattern dependent filtering on the equalized output is performed for a second pattern (e.g., '001') using a second target to yield a second noise predictive output, pattern dependent filtering on the equalized output is performed for a third pattern (e.g., '010') using a third target to yield a third noise predictive output, pattern dependent filtering on the equalized output is performed for a fourth pattern (e.g., '011') using a fourth target to yield a fourth noise predictive output, pattern dependent filtering on the equalized output is performed for a fifth pattern (e.g., '100') using a fifth target to yield a fifth noise predictive output, pattern dependent filtering on the equalized output is performed for a sixth pattern (e.g., '101') using a sixth target to yield a sixth noise predictive output, pattern dependent filtering on the equalized output is performed for a seventh pattern (e.g., '110') using a seventh target to yield a seventh noise predictive output, and pattern dependent filtering on the equalized output is performed for a eighth pattern (e.g., '111') using an eighth target to yield an eighth noise predictive output. Of note, flow diagram 300 is described as including eight pattern dependent filter circuits, but other embodiments of the present invention may be implemented to include more or fewer than eight pattern dependent filter circuits.

A data detection is performed using the eight noise predictive outputs to yield a detected output (block 325). In some embodiments of the present invention, the data detection is a Viterbi algorithm data detection as is known in the art. Based upon the disclosure provided herein, one of ordinary skill in the art will recognize other data detection algorithms that may be used in relation to different embodiments of the present invention. Data decoding is applied to the detected output to yield a decoded output (block 335). The decoding algorithm may be, but is not limited to, a low density parity check decoding algorithm as are known in the art. It is determined whether the decoding converged (block 340). Where the decode algorithm converged (i.e., there are no remaining unsatisfied checks)(block 340), the decoded output is provided as a data output (block 345). Alternatively, where the data decoding algorithm failed to converge (i.e., there are remaining unsatisfied checks) (block 340), the decoded output is provided to guide a subsequent performance of the data detection algorithm to yield an updated detected output (block 325).

The detected output and the eight noise predictive outputs are used to calculate updated target values (block 330). In particular, an updated first target is calculated in accordance with the following equation:

First Target = $T1, T2, T3$(Next Period) = $T1, T2,$ $$T3(\text{Prior Period}) - \eta * b_{D-j} \times \left(\text{First noise predictive output} - \sum_{j=1}^{D} T_j b_{D-j}\right);$$

an updated second target is calculated in accordance with the following equation:

$$\text{Second Target} = T1, T2, T3(\text{Next Period}) = T1, T2, T3(\text{Prior Period}) - \eta * b_{D-j} \times \left( \text{Second noise predictive output} - \sum_{j=1}^{D} T_j b_{D-j} \right);$$

an updated third target is calculated in accordance with the following equation:

$$\text{Third Target} = T1, T2, T3(\text{Next Period}) = T1, T2,$$
$$T3(\text{Prior Period}) - \eta * b_{D-j} \times \left( \text{Third noise predictive output} - \sum_{j=1}^{D} T_j b_{D-j} \right);$$

an updated fourth target is calculated in accordance with the following equation:

$$\text{Fourth Target} = T1, T2, T3(\text{Next Period}) = T1, T2, T3(\text{Prior Period}) - \eta * b_{D-j} \times \left( \text{Fourth noise predictive output} - \sum_{j=1}^{D} T_j b_{D-j} \right);$$

an updated fifth target is calculated in accordance with the following equation:

$$\text{Fifth Target} = T1, T2, T3(\text{Next Period}) = T1, T2,$$
$$T3(\text{Prior Period}) - \eta * b_{D-j} \times \left( \text{Fifth noise predictive output} - \sum_{j=1}^{D} T_j b_{D-j} \right);$$

an updated sixth target is calculated in accordance with the following equation:

$$\text{Sixth Target} = T1, T2, T3(\text{Next Period}) = T1, T2,$$
$$T3(\text{Prior Period}) - \eta * b_{D-j} \times \left( \text{Sixth noise predictive output} - \sum_{j=1}^{D} T_j b_{D-j} \right);$$

an updated seventh target is calculated in accordance with the following equation:

$$\text{Seventh Target} = T1, T2, T3(\text{Next Period}) = T1, T2, T3(\text{Prior Period}) - \eta * b_{D-j} \times \left( \text{Seventh noise predictive output} - \sum_{j=1}^{D} T_j b_{D-j} \right);$$

and an updated eighth target is calculated in accordance with the following equation:

$$\text{Eighth Target} = T1, T2, T3(\text{Next Period}) = T1, T2,$$
$$T3(\text{Prior Period}) - \eta * b_{D-j} \times \left( \text{Eighth noise predictive output} - \sum_{j=1}^{D} T_j b_{D-j} \right).$$

These updated target values are used to perform a subsequent noise predictive filtering (block 320). In some cases, initially T1 may be set to a value of '1', and T2 and T3 are each initially set to a value of '0'.

As set forth above, the target adaptation is pattern dependent. As an example, the adaptation of the respective target values may proceed as:

(A) The first noise predictive output is used to train the target corresponding to paths '0000' and '1000' of the Viterbi trellis; the second noise predictive output is used to train the target corresponding to paths '0001' and '1001' of the Viterbi trellis; the third noise predictive output is used to train the target corresponding to paths '0010' and '1010' of the Viterbi trellis; the fourth noise predictive output is used to train the target corresponding to paths '0011' and '1011' of the Viterbi trellis; the fifth noise predictive output is used to train the target corresponding to paths '0100' and '1100' of the Viterbi trellis; the sixth noise predictive output is used to train the target corresponding to paths '0101' and '1101' of the Viterbi trellis; the seventh noise predictive output is used to train the target corresponding to paths '0110' and '1110' of the Viterbi trellis; and the eighth noise predictive output is used to train the target corresponding to paths '0111' and '1111' of the Viterbi trellis.

(B) The adaptive algorithm set forth above is applied for each pattern dependent filter circuit of the noise predictive filter circuit.

Figure 4:
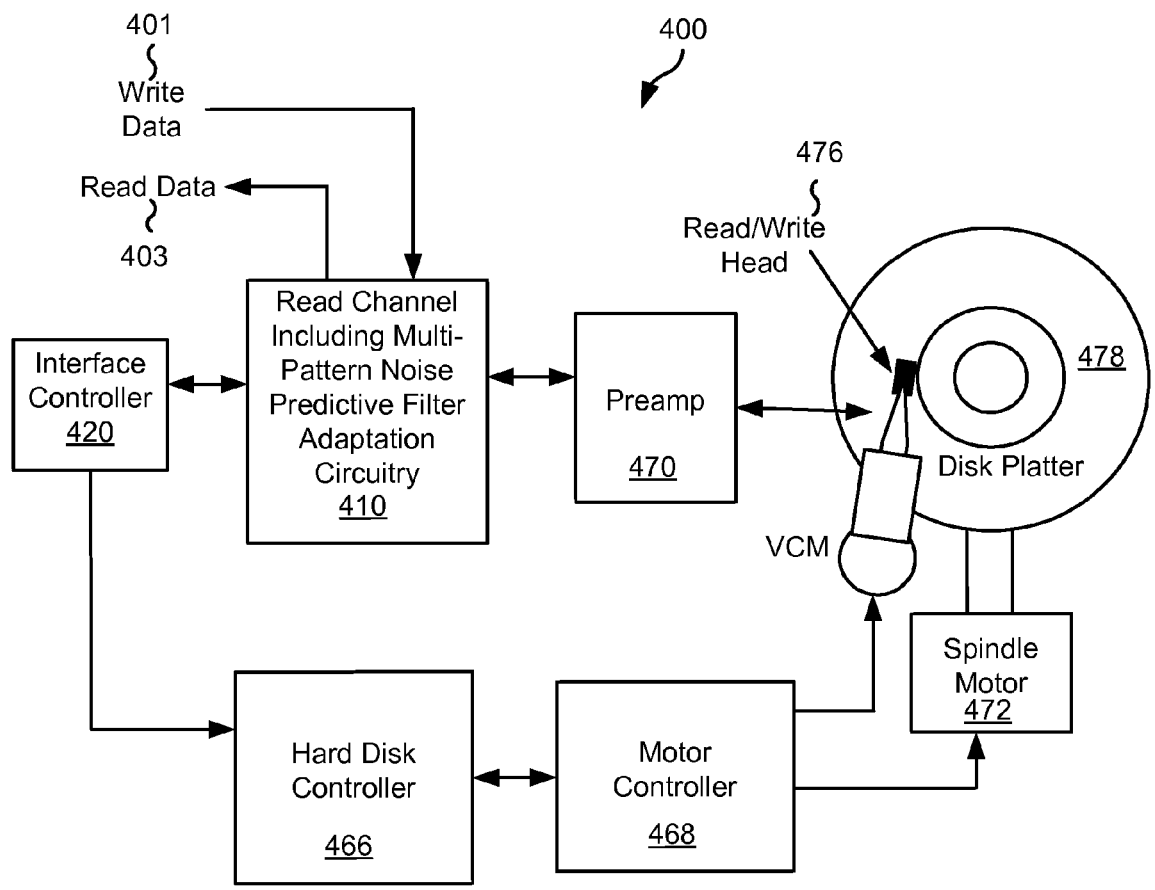
FIG. 4 shows a storage device including a read channel having multi-pattern noise predictive filter adaptation circuitry.

Turning to FIG. 4, a storage system 400 including a read channel circuit 410 including a multi-pattern noise predictive filter adaptation circuitry is shown in accordance with some embodiments of the present invention. Storage system 400 may be, for example, a hard disk drive. Storage system 400 also includes a preamplifier 470, an interface controller 420, a hard disk controller 466, a motor controller 468, a spindle motor 472, a disk platter 478, and a read/write head assembly 476. Interface controller 420 controls addressing and timing of data to/from disk platter 478. The data on disk platter 478 consists of groups of magnetic signals that may be detected by read/write head assembly 476 when the assembly is properly positioned over disk platter 478. In one embodiment, disk platter 478 includes magnetic signals recorded in accordance with either a longitudinal or a perpendicular recording scheme.

In a typical read operation, read/write head assembly 476 is accurately positioned by motor controller 468 over a desired data track on disk platter 478. Motor controller 468 both positions read/write head assembly 476 in relation to disk platter 478 and drives spindle motor 472 by moving read/write head assembly to the proper data track on disk platter 478 under the direction of hard disk controller 466. Spindle motor 472 spins disk platter 478 at a determined spin rate (RPMs). Once read/write head assembly 478 is positioned adjacent the proper data track, magnetic signals representing data on disk platter 478 are sensed by read/write head assembly 476 as disk platter 478 is rotated by spindle motor 472. The sensed magnetic signals are provided as a continuous, minute analog signal representative of the magnetic data on disk platter 478. This minute analog signal is transferred from read/write head assembly 476 to read channel circuit 410 via preamplifier 470. Preamplifier 470 is operable to amplify the minute analog signals accessed from disk platter 478. In turn, read channel circuit 410 decodes and digitizes the received analog signal to recreate the information originally written to disk platter 478. This data is provided as read data 403 to a receiving circuit. A write operation is substantially the opposite of the preceding read operation with write data 401 being provided to read channel circuit 410. This data is then encoded and written to disk platter 478.

During a read operation, data received from preamplifier circuit 470 is converted from an analog signal to a series of corresponding digital samples, and the digital samples are equalized to yield an equalized output. The equalized output is then provided to a noise predictive filter circuit that includes a number of pattern dependent filter circuits. The output from the pattern dependent filter circuits are used in relation to a data detection algorithm to yield a detected output. The multi-pattern noise predictive filter adaptation circuitry is operable to adaptively train a respective target for each of the pattern dependent filter circuits. The multi-pattern noise predictive filter adaptation circuitry may be implemented similar to that described above in relation to FIG. 1 and/or operates similar to the method discussed above in relation to FIG. 3.

It should be noted that storage system 400 may be integrated into a larger storage system such as, for example, a RAID (redundant array of inexpensive disks or redundant array of independent disks) based storage system. It should also be noted that various functions or blocks of storage system 100 may be implemented in either software or firmware, while other functions or blocks are implemented in hardware.

Figure 5:
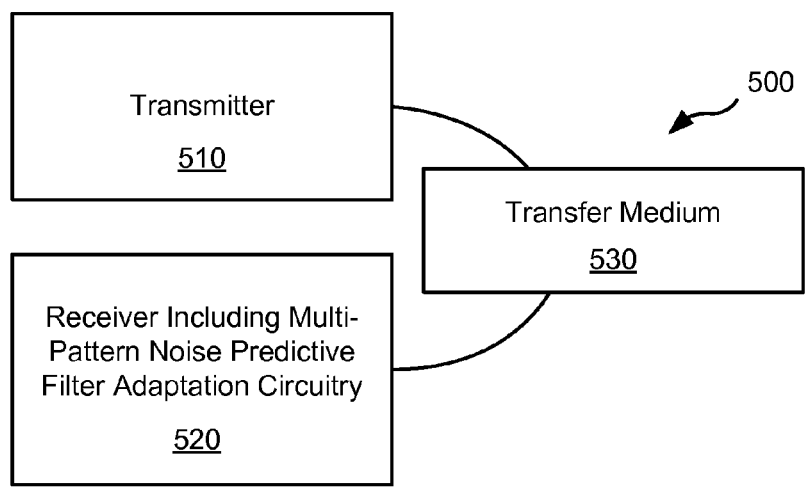
FIG. 5 shows a data transmission system including a read channel having multi-pattern noise predictive filter adaptation circuitry.

Turning to FIG. 5, a data transmission system 500 including a receiver 520 having multi-pattern noise predictive filter adaptation circuitry is shown in accordance with some embodiments of the present invention. Data transmission system 500 includes a transmitter 510 that is operable to transmit encoded information via a transfer medium 530 as is known in the art. The encoded data is received from transfer medium 530 by receiver 520. Receiver 520 incorporates multi-pattern noise predictive filter adaptation circuitry. While processing received data, an analog signal is converted to a series of corresponding digital samples, and the digital samples are equalized to yield an equalized output. The equalized output is then provided to a noise predictive filter circuit that includes a number of pattern dependent filter circuits. The output from the pattern dependent filter circuits are used in relation to a data detection algorithm to yield a detected output. The multi-pattern noise predictive filter adaptation circuitry is operable to adaptively train a respective target for each of the pattern dependent filter circuits. The multi-pattern noise predictive filter adaptation circuitry may be implemented similar to that described above in relation to FIG. 1 and/or operates similar to the method discussed above in relation to FIG. 3.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing circuit comprising:
   a noise predictive filter circuit including at least a first pattern dependent filter circuit operable to perform noise predictive filtering on a data input for a first pattern using a first adaptive target to yield a first noise predictive output, and a second pattern dependent filter circuit operable to perform noise predictive filtering on the data input for a second pattern using a second adaptive target to yield a second noise predictive output;
   data detector circuit operable to apply a data detection algorithm to the first noise predictive output and the second noise predictive output to yield a detected output;
   a first pattern dependent adaptive target circuit operable to adaptively calculate the first adaptive target based at least in part on the first noise predictive output and a training sequence including multiplying an ideal output by a programmable adaptation gain; and
   a second pattern dependent adaptive target circuit operable to adaptively calculate the second adaptive target based at least in part on the second noise predictive output and the training sequence.

2. The data processing system of claim 1, wherein the training sequence is a portion of the detected output corresponding to the data input.

3. The data processing system of claim 1, wherein the training sequence is a known data set stored in a memory.

4. The data processing system of claim 1, wherein the data detection algorithm is selected from a group consisting of: a Viterbi data detection algorithm, and a maximum a posteriori data detection algorithm.

5. The data processing system of claim 1, wherein the data processing circuit further comprises:
   a data decoding circuit operable to apply a data decode algorithm to the detected output to yield a decoded output.

6. The data processing system of claim 5, wherein the data decode algorithm is a low density parity check algorithm.

7. The data processing system of claim 1, wherein the data processing circuit further comprises:
   an analog to digital converter circuit operable to convert an analog input into a series of digital samples; and
   an equalizer circuit operable to receive the series of digital samples and to equalize the series of digital samples to yield the data input.

8. The data processing system of claim 1, wherein the data processing circuit is implemented as part of a device selected from a group consisting of: a storage device and a receiving device.

9. The data processing system of claim 1, wherein the data processing circuit is implemented as part of an integrated circuit.

10. The data processing system of claim 1, wherein the ideal output is calculated in accordance with the following equation:

$$\text{ideal output} = \sum_{j=1}^{D} T_j b_{D-j},$$

wherein D is the depth of a pattern, T is the adaptive target, and b is the training sequence.

11. A method, the method comprising:
receiving a data input;
pattern dependent filtering the data input using a first pattern dependent filter for a first pattern using a first adaptive target to yield a first noise predictive output;
pattern dependent filtering the data input using a second pattern dependent filter for a second pattern using a second adaptive target to yield a second noise predictive output;
applying a data detection algorithm to the first noise predictive output and the second noise predictive output to yield a detected output;
calculating in a first pattern dependent adaptive target circuit the first adaptive target based at least in part on the first noise predictive output and a training sequence including multiplying an ideal output by a programmable adaptation gain; and
calculating in a second pattern dependent adaptive target circuit the second adaptive target based at least in part on the second noise predictive output and the training sequence.

12. The method of claim 11, herein the ideal output is calculated in accordance with the following equation:

$$\text{ideal output} = \sum_{j=1}^{D} T_j b_{D-j},$$

wherein D is the depth of a pattern, T is the adaptive target, and b is the training sequence.

13. The method of claim 11, wherein the method further comprises:
applying a low density parity check algorithm to the detected output to yield a decoded output.

14. The method of claim 11, wherein the data detection algorithm is selected from a group consisting of: a Viterbi data detection algorithm, and a maximum a posteriori data detection algorithm.

15. The method of claim 11, wherein the training sequence is a portion of the detected output corresponding to the data input.

16. The method of claim 11, wherein the training sequence is a known data set stored in a memory.

17. A storage device, the storage device comprising:
a storage medium;
a head assembly disposed in relation to the storage medium and operable to provide a sensed signal corresponding to information on the storage medium;
a read channel circuit including:
an analog to digital converter circuit operable to sample an analog signal derived from the sensed signal to yield a series of digital samples;
an equalizer circuit operable to equalize the digital samples to yield an equalized output;
a noise predictive filter circuit including at least a first pattern dependent filter circuit operable to perform noise predictive filtering on the equalized output for a first pattern using a first adaptive target to yield a first noise predictive output, and a second pattern dependent filter circuit operable to perform noise predictive filtering on the equalized output for a second pattern using a second adaptive target to yield a second noise predictive output;
a data detector circuit operable to apply a data detection algorithm to the first noise predictive output and the second noise predictive output to yield a detected output;
a first pattern dependent adaptive target circuit operable to adaptively calculate the first adaptive target based at least in part on the first noise predictive output and a training sequence including multiplying an ideal output by a programmable adaptation gain; and
a second pattern dependent adaptive target circuit operable to adaptively calculate the second adaptive target based at least in part on the second noise predictive output and the training sequence.

18. The storage device of claim 17, wherein the training sequence is a portion of the detected output corresponding to the data input.

19. The storage device of claim 17, wherein the training sequence is a known data set stored in a memory.

20. The storage device of claim 17, wherein the storage further comprises:
a data decoding circuit operable to apply a low density parity check algorithm to the detected output to yield a decoded output.

* * * * *